United States Patent [19]

Wilkie et al.

[11] Patent Number: 5,443,915
[45] Date of Patent: Aug. 22, 1995

[54] BIAXIALLY ORIENTED POLYPROPYLENE METALLIZED WHITE FILM FOR COLD SEAL APPLICATIONS

[75] Inventors: Andrew F. Wilkie, Haverhill; Michael D. Butler, North Andover, both of Mass.

[73] Assignee: Borden, Inc., Columbus, Ohio

[21] Appl. No.: 267,420

[22] Filed: Jun. 28, 1994

Related U.S. Application Data

[63] Continuation-in-part of Ser. No. 223,171, Apr. 5, 1994.

[51] Int. Cl.⁶ .............................................. B32B 15/08
[52] U.S. Cl. .................................... 428/461; 428/204; 428/331; 428/402; 428/451; 428/454; 428/456; 428/500; 428/515; 428/688; 428/689
[58] Field of Search ............... 428/304.4, 307.3, 308.4, 428/349, 461, 910, 515, 204, 331, 402, 451, 454, 456, 461, 500, 688, 689; 521/139

[56] References Cited

U.S. PATENT DOCUMENTS

| | | | |
|---|---|---|---|
| 4,230,767 | 10/1980 | Isaka et al. | 428/349 |
| 4,293,608 | 10/1981 | Isaka et al. | 428/220 |
| 4,357,383 | 11/1982 | Howden et al. | 428/213 |
| 4,692,380 | 3/1987 | Reid | 428/349 |
| 4,741,950 | 5/1988 | Liu et al. | 428/315.5 |
| 4,758,396 | 7/1988 | Crass et al. | 264/145 |
| 4,777,081 | 10/1988 | Crass et al. | 428/215 |
| 4,888,237 | 12/1989 | Balloni et al. | 428/347 |
| 4,944,990 | 7/1990 | Liu et al. | 428/353 |
| 4,997,700 | 3/1991 | Bothe et al. | 428/216 |
| 5,026,592 | 6/1991 | Janocha et al. | 428/204 |
| 5,091,236 | 2/1992 | Keller et al. | 428/213 |
| 5,134,173 | 7/1992 | Joesten et al. | 521/139 |
| 5,176,954 | 1/1993 | Keller et al. | 428/317.9 |
| 5,194,318 | 3/1993 | Miliorini et al. | 428/215 |
| 5,209,884 | 5/1993 | Wood, Jr. | 264/41 |
| 5,318,834 | 6/1994 | Foulkes et al. | 428/304.4 |

OTHER PUBLICATIONS

Tech. Info. Bulletin FC-25B of Hercules, Inc. for Hercules WTE 503.
Spec. Sheet for OPPTI Wrap OHCTW of Borden, Inc.
Spec. Sheet for CCO Two Sided Modified OPP Film of Borden, Inc.

Primary Examiner—Patrick J. Ryan
Assistant Examiner—William A. Krynski
Attorney, Agent, or Firm—Stevens, Davis, Miller & Mosher

[57] ABSTRACT

There is disclosed an oriented, polyolefin film having a white-opaque cold seal receptive skin layer on one side of a core layer and a vacuum deposited metal layer on the other side of the core layer. The cold seal receptive polyolefin layer contains: (a) a slip agent in an amount sufficient to provide not more than about an 0.4 coefficient of friction to the surface of such layer; and (b) from about 10 to 40% by weight of titanium dioxide. The core layer is substantially free of opacifying filler and/or opacifying voids. The other side of the film is metallized to an optical density of at least 1.5 whereby the white pigment in the sealing layer in cooperation with the metallization gives a strong white-opaque appearance to the cold seal receptive layer.

23 Claims, No Drawings

BIAXIALLY ORIENTED POLYPROPYLENE METALLIZED WHITE FILM FOR COLD SEAL APPLICATIONS

This application is a continuation-in-part of our application Ser. No. 08/223,171 which was filed on Apr. 5, 1994.

FIELD OF THE INVENTION

This invention relates to an oriented polyolefinic laminated film which has a core, a titanium dioxide containing white-partially opaque cold seal receptive polyolefinic skin layer on one side of the core, and a metallized surface on the other side of the core. The titanium dioxide in cooperation with the obverse metallized surface of the film provides a strong white-opaque appearance when viewing the cold seal receptive layer. In a preferred form, the film is biaxially oriented and contains significant quantities of isotactic polypropylene homopolymer.

BACKGROUND OF THE INVENTION (a) Field of the Invention

White biaxially oriented polypropylene films have traditionally been produced using a cavitated/expanded core in order to achieve opacity. The cavitated/expanded core weakens the core which is generally the thickest layer of such films.

In the invention of this application, a thin polyolefinic skin layer containing titanium dioxide is used to form a cold seal receptive layer which, in cooperation with the metallized surface on the opposite side of the core layer, enhances the white coloration of the titanium dioxide containing layer. Such films have better physical properties, e.g., tensile strengths, since the core has not been modified for opaqueness.

The cold seal receptive polyolefinic layer is on one side of the core and preferably a polyolefinic skin layer which is subsequently metallized is on the other side of the core. Each of the skin layers has a thickness of less than one-fifth of that of the core. Thus, the core can contain a large percentage of a high tensile strength polyolefin such as isotactic polypropylene homopolymer or high density polyethylene homopolymer whereas the skin layers are thin and provide for a film which has high tensile strength for its overall thickness.

(b) Discussion of the Prior Art

1. U.S. Pat. No. 4,230,767 of 10-28-80 to T. Isaka, et al. discloses an oriented heat sealable film of a polypropylene polymer base layer and a surface layer or layers of a copolymer of ethylene and propylene and a copolymer of butene and any other polymerizable monomer having ethylenic unsaturation. One surface of the film can be subjected to electro-discharge treatment. Slip agents and antiblocking agents can be added to the film.

2. U.S. Pat. No. 4,357,383 of 11-02-82 to M. Howden et al. discloses a multi-layer metallized film of an alpha-olefin having on at least one surface an adherent layer of random copolymer of ethylene with 0.5 to 15% of 3-6 carbon alpha-olefin and a metallic layer on the surface of the adherent layer remote from the substrate. Among a number of options, this film can also have a heat seal layer on the surface opposite from the metallized layer.

3. U.S. Pat. No. 4,692,380 of 09-08-87 to D. Reid discloses a metallized, biaxially oriented polypropylene film which exhibits good adhesion between the polypropylene and the metal coating. The core has on at least one surface a propylene-ethylene copolymer which contains no slip agent and which has been subjected to corona treatment.

4. U.S. Pat. No. 4,741,950 of 05-03-88 to L. Liu et al. discloses an oriented, opaque, alpha-olefin laminate film having a non-blocking first surface, a smooth lustrous second surface which is intended for further film processing operations such as metallization and an expanded core to provide opacity. The core can optionally also contain additional filler for opacity and the anti-blocking skin layer optionally contains 2% to 8% of titanium dioxide to confer enhanced opacity. Among other shortcomings this patent uses voids in the core which adversely affect the mechanical properties and the anti-blocking layer is not heat sealable.

5. U.S. Pat. No. 4,758,396 of 07-19-88 to B. Crass et al. discloses biaxially oriented film having a single ply or an opaque core layer of a multiply film composed essentially of polypropylene. The opaque core layer includes 10-40% of filler. Titanium dioxide is mentioned as one of the fillers. In addition to the polypropylene opaque single ply or multiply layered film such film can include functional layers such as heat sealing, cold sealing, adhesion promoting, dye coating, and metallizable layers. The film of this prior patent has a density of 0.6 grams per cubic centimeter.

6. U.S. Pat. No. 4,997,700 of 03-05-91 to L. Bothe et al. discloses a metallizable, heat sealable, biaxially oriented multilayer film which comprises a polypropylene core layer, a first polyolefin heat-sealable surface layer and a second polyolefin metallizable surface layer. The metallizable layer comprises a propylene-ethylene copolymer containing from 1.2 to 2.8 % of ethylene. The heat sealable layer comprises ethylene containing polymers, copolymers of ethylene and propylene or copolymers of propylene and 1-butane as well as other olefinic mixtures. In contrast to densities of about 0.85 to 9.5 grams per cubic centimeter for the films of this invention, the density of the U.S. Pat. No. 4,997,700 patent is recited as 0.8 grams per cubic centimeter or less, particularly 0.65 grams per cubic centimeter or less.

7. U.S. Pat. No. 5,026,592 of 06-25-91 to S. Janocha et al. discloses an opaque, biaxially stretched oriented, polyolefinic multilayered film comprising an opaque core layer and two transparent skin layers. The opaqueness is attained by the use of inorganic fillers in the core layer. Titanium dioxide is mentioned along with many different fillers as suitable. Among many different options the top layers can be sealable or non-sealable and metallized or non-metallized.

8. U.S. Pat. No. 5,091,236 of 02-25-92 to L. Keller et al. discloses a multilayer opaque, biaxially oriented polymeric film. The film structure includes: (a) a core layer having voids which cause a significant degree of opacity; (b) a layer adhering to the core Layer including up to about. 12% of titanium dioxide: and a titanium dioxide-free non-voided thermoplastic skin layer adhering to the other side of the core layer. The titanium dioxide improves opacity and whiteness of the film.

9. HERCULES WTF 503 is a non-sealable film having a white-opaque oriented polypropylene core and a metallizable surface designed for the insulation market. This product is sold by Hercules, Inc.

The present invention has the following main advantages over the prior art:

1. A significant white-opaque appearance is achieved by cooperation of the metallized layer with the layer containing the titanium dioxide without the need for cavitation, expansion, or inert filling of the core layer. This also eliminates the need for white color printing of the film. This provides for the use of smaller quantities of filler to attain the white-opaque look as compared to fillers in the core, provides better mechanical properties, and is more economical.

2. The white pigmented layer provides excellent cold seal receptivity and adhesion in spite of the relatively large percentage concentration of filler in this thin layer.
3. The excellent mechanical properties such as high stiffness and tensile strength of conventional polyolefin films, e.g., biaxially oriented isotactic polypropylene homopolymer film, are maintained versus cavitated, expanded, or filled opaque polyolefin film.
4. Thinner gauges (higher yields) of laminated film can be used versus cavitated/expanded, opaque alpha-olefin film thus providing a cost advantage.
5. Excellent metal bond strength as well as excellent gas barrier properties are obtained.

The films of this invention are particularly useful as wrappers or packages for confectionery and baked items, e.g., candy bars, cup cakes, and frozen confections such as ice cream bars. The consuming public appears to associate the white coloration with sanitation and such white coloration helps mask oil and grease from the confectionery or baked items.

SUMMARY OF THE INVENTION

This invention provides a white-opaque, oriented, and metallized polyolefin film prepared from at least 2 polyolefin layers. One layer is a cold seal receptive skin layer which contains: (a) a slip agent in an amount sufficient to provide not more than about an 0.4 coefficient of friction to the surface of such layer and can have its surface physically modified such as by chemical, flame, or corona treatment so as to increase its receptivity to other coatings; and (b) from about 10 to 40% of titanium dioxide. Another layer is the core layer which is transparent and substantially free of cavitations, opacifying expansions, or fillers. The obverse surface from the cold seal receptive layer is metallized to an optical density of at least 1.5 whereby the white pigment in the cold seal receptive layer in cooperation with the metallization gives a strong white-opaque appearance to the cold seal receptive layer.

The polymers are predominantly that of alpha-olefins having up to about 10 carbon atoms, e.g., homopolymers, copolymers, and terpolymers, such as those containing ethylene and or propylene.

DETAILED DESCRIPTION OF THE INVENTION

The Core Layer

The polyolefinic core is transparent and free of fillers and voids such as those caused by cavitation or expansion which produce opaqueness. Generally, the core contains polymers of alpha-olefins such as that polypropylene, e.g., isotactic polypropylene homopolymer, polyethylene such as a high density polyethylene, random or block copolymers of ethylene and propylene, and mixtures of the foregoing. The isotactic polypropylene homopolymer used in this invention will contain at least about 80% and preferably at least 90% or 95% by weight of isotactic polypropylene units. Illustratively, the core can be that of from about 90% to 99% by weight of isotactic polypropylene homopolymer together with from about 1% to 10% by weight of the core of high density polyethylene. Another illustrative core layer composition is that of a random or block copolymer of ethylene and propylene containing about 90% to 99.5% of propylene and 0.5% to 10% of ethylene based on the weight of the copolymer with or without high density polyethylene such as that of about 1% to 50% by weight of the core. A preferred core is about 60 gauge in thickness and has a polyolefin composition of about 97% of isotactic polypropylene homopolymer and 3% of high density polyethylene based on the weight of the core.

Optionally, the core layer will contain an antistatic agent in an amount sufficient to inhibit the build up of static electricity, such as that which can occur during corona treatment of the film. Such quantity can vary over a wide range such as that of about 0.01 to 0.1% by weight of the core layer. Illustrative of suitable antistatic agents there can be mentioned fatty acid esters and amides of fatty acids having from about 12 to 20 carbon atoms such as those of glycols , and glycerine, e.g., glycerol monostearate.

The thickness of the core layer can vary over a wide range such as that of from about 50 to 120 gauge, e.g. from about 55 to 80 gauge, and preferably about 60 gauge, i.e. 60 thousandths of an inch.

The Cold Seal Receptive Layer

The polyolefinic cold seal receptive layer contains a polymer of suitable alpha-olefins as well as particulate titanium dioxide and a slip agent intimately admixed in the olefinic polymer. A preferred composition for the cold seal receptive layer is: (a) about 60% to 90% by weight of an ethylene-propylene random copolymer containing about 2% to 10% by weight of ethylene; and about 10% to 40% by weigh of titanium dioxide and (c) a slip or antiblocking agent. Preferably, the slip agent should not migrate out of the cold seal receptive layer since such migration has an adverse effect on the subsequently applied cold seal adhesive composition. Suitable slip agents are normally solid, e.g., solid inorganic slip agents.

A number of advantages accrue when the polymer of the cold seal receptive layer is an ethylene-propylene random copolymer containing 2% to 10% by weight of ethylene and 90% to 98% by weight of propylene. The layer of oriented film of such random copolymer with the titanium dioxide dispersed therein does not have the extensive cavitations and voids as is the case when the polymeric layer is that of a higher melting polymer such as isotactic polypropylene homopolymer. The oriented non-cavitated layer of this random copolymer is advantageous since cavities and voids: reduce mechanical strength; lower the film density; and increase pump down time due to evacuating air from the micropores in the film layer when the film is vacuum metallized. Additionally, the oriented non-cavitated titanium dioxide containing ethylene-propylene random copolymer layer has a higher surface gloss as compared to the surface gloss of a traditional cavitated white opaque layer of isotactic polypropylene homopolymer.

The cold seal receptive layer will eventually have a layer of polymeric composition applied thereto in order to effectuate the cold sealing. This does not significantly affect the white-opaque appearance. Cold seal compositions are generally natural or synthetic rubber latex compositions which when applied to a flexible film allow the film to be cohesively sealed about the item being packaged by pressure and adequate dwell time at ambient temperature. By "cold seal" herein is meant the sealing or bonding of a film layer to itself at a temperature of less than about 150° F. Cold seal compositions are particularly useful in wrapping products which are heat sensitive, such as confectioneries.

The cold seal receptive layer is also preferably treated to modify its surface so that it has improved receptivity to the cold seal composition which will later be applied thereto. Such surface modification can be by conventional means such as chemical, flame or corona treatment.

The cold seal receptive skin layer will contain an effective amount of a slip agent to improve the mechanical properties of the surface of this layer. Generally, it is desirable to reduce the slip to a coefficient of friction (COF) of not more than about 0.4. By this means, blocking of adjacent layers of film on mill rolls is prevented and the film can readily be unwound for use or for further processing. The quantity of slip agent, also referred to herein as anti-blocking agent, is also sufficient to substantially eliminate blocking of the film. In the absence of the slip agent, the layer-to-layer COF is so great that smooth unwinding of the film is virtually impossible.

Illustrative of suitable non-migratory slip agents, also referred to as anti-blocking agents for the cold seal receptive layer, there can be mentioned: cross-linked silicone such as TOSPEARL of Toshiba Silicone Co., Ltd., silica, silicates such as magnesium silicate, clay such as kaolin, diatomaceous earth, talc, glass beads, calcium carbonate, and the like. Such solid slip agents are generally provided in the form of approximately spheroidal particles having a particle size range of from about 0.5 to about 10 microns. A preferred slip agent for the cold seal receptive layer is about 0.1% to 1% by weight of that layer of about 1 to 4.5 micron cross-linked silicone.

The amount of the slip agent in the cold seal receptive layer is that amount sufficient to prevent blocking and to provide good machinability such as that which provides the film layer with a COF of less than about 0.4, e.g., from abut 0.2 to about 0.4. The quantity of the slip or anti-blocking agent normally used in this film layer involved can vary from about 0.01% to 1% by weight such as 0.2 to 0.5%. A preferred kinetic coefficient of friction on the cold seal receptive layer side is about 0.28. The coefficient of friction is measured by ASTM: D-1894-87.

The cold seal receptive layer will have titanium dioxide dispersed therein. The quantity of particulate titanium dioxide in the cold seal receptive layer will vary from about 10% to 40% by weight of the skin layer such as about 15% to 35%. A concentration of 25% of rutile titanium dioxide is preferred. The cold seal receptivity of this layer is unaffected by incorporation of these relatively large quantities of titanium dioxide.

The titanium dioxide containing layer is not opaque in and of itself as the case with the expanded/cavitated cores but rather appears opaque in cooperation with the metallized layer.

The thickness of the cold seal receptive layer will generally vary from about 4 to 10 gauge and particularly about 7 gauge. The thicker gauge provides the greater amount of whiteness.

The Metallizable Layer

When a separate, i.e., second polyolefinic skin layer, is used for the metallizable surface instead of the core, such layer can be that of an alpha-olefin homopolymer or copolymer such as one having 2 to 3 carbon atoms, e.g., a homopolymer of isotactic polypropylene, random or block ethylene-propylene copolymer and mixtures thereof. The random or block copolymers for this layer will generally contain from about 0.5% to 10% by weight of ethylene and 90% to 99.5% by weight of propylene. One such random copolymer is that of ethylene and propylene containing less than 10% by weight of ethylene, e.g. 2% to 8%. As with the core, such olefinic layer is transparent and substantially free of cavitation, voids, opacifying expansions, and fillers.

The metallizable layer can optionally also contain an adhesion promoting agent, particularly with the isotactic homopolymer of propylene to improve adhesion to the vacuum metallized metal surface. Such adhesion promoters include powdered polyamides, e.g. Nylon 6, clay, random copolymers of 1 to 4 carbon atoms as well as polar polymers such as those containing acrylic or methacrylic acid in a quantity sufficient to enhance adhesion of the metal to the treated skin surface. Such quantity can vary over a broad range such as from about 0.1% to 1% by weight of the metallizable skin layer. A preferred metallizable layer has a thickness of about 5 gauge and has a polyolefin composition which consists of ethylene-propylene random copolymer containing about 3% by weight of ethylene.

The metallization is preferably achieved by placing a vacuum deposited metal layer, preferably aluminum, on to the polyolefinic corona treated skin layer or core surface of the film. In many applications, a thin transparent polymeric film, e.g., polypropylene, is placed over the metallization in order to protect it from abrasion, etc.

The amount of metal deposition on the treated second skin layer should be sufficient to provide an optical density to the film of at least 1.5 such as 1.75 or 2.0, and preferably 2.4. Optical density is measured with a MacBeth TD. 904 Optical Densitometer. Such densitometer has an optical density range of 0 to 4 with 0 being 100% light transmission and 4 being 0% light transmission. An optical density of 2 has a light transmission of 1%. Preferred metallizable film of this invention having a heat sealable layer, a core, and a metallizable layer, prior to corona treatment and metallization, will have a light transmission of about 74%. Thus, it can be seen that the titanium dioxide in the sealing layer does not have much effect on opaqueness.

In structures wherein the metallizing is on a separate polyolefin layer from that of the core, the thickness of such layer will generally vary from about i to 10 gauge and preferably about 5 gauge.

The preferred film has a core layer, a cold seal corona discharge treated receptive layer on one side of the core, and, on the other side of the core, a corona treated metallizable layer to which a vacuum deposited aluminum metal layer has been placed. The total thickness of such film is about 0.7 to 1.15 mil.

Manufacture of the film is carried out by known coextrusion processes. This includes coextruding through a flat film die the melt corresponding to the individual layers of the film, cooling the film obtained by coextrusion in order to harden it, orienting, e.g. biaxially stretching, the film, heat-setting the stretched film and corona treating the metallizable surface layer and generally the cold seal receptive layer. The film can also be made by the blown film or double bubble orientation process.

Preferably, the cold seal receptive layer is coextruded on to a bulk core layer of a conventional, non-pigmented, non-cavitated and non-expanded, alpha-olefin of 2 to 4 carbon atoms. Also, the skin layers of an alpha-olefin having 2 to 4 carbon atoms suitable for further treatment are coextruded on opposite sides of the core.

The composition of the cold seal receptive layer is preferably produced employing the masterbatch method, e.g., the titanium dioxide is first intimately dispersed with the alpha-olefin polymer, generally a block or random copolymer of 2 to 4 carbon atoms, and such mixture is then mixed in with the remaining ingredients of the heat sealable film layer. A masterbatch which applicants have found to be particularly suitable is P8555SC of A. Schulman, Inc. which contains about 50% by weight of titanium dioxide and about 50% of ethylene-propylene random copolymer.

The laminated film structure comprising the core and adherent skins is stretched by conventional techniques to orient the film, prior to corona discharge and deposition of a metallic layer on to the metallizable skin layer. Orientation may be effected uniaxially, by stretching the film in one direction or biaxially, by stretching the film in each of two mutually perpendicular directions in the plane of the film. Biaxial orientation is preferred.

The degree to which the film is stretched depends to some extent on the ultimate use for which the film is intended. Preferably, the film is stretched to between about 4 to 6.5 times its original dimension in the longitudinal direction and about 5 to 10 times in the transverse direction. The longitudinal stretching is expeditiously carried out with the aid of two rolls running at different speeds according to the stretch ratio desired and the transverse stretching with the aid of a corresponding tenter frame.

After stretching the polymeric film is normally "heat set", while restrained against shrinkage at a temperature above the glass transition temperature of the polymer and below its melting point.

Prior to deposition of the metallic layer onto the separate adherent metallizable layer or the exposed surface of the core itself when a separate layer is not used, the exposed surface thereof is subjected to a physical surface-modifying treatment to improve the bond between that surface and the subsequently applied metal which forms a metallic layer. A preferred treatment is to subject the exposed surface to a high voltage electrical stress accompanied by corona discharge. The film is then heat aged to impart further dimensional stability to the film.

Deposition of the metallic layer onto the skin layer may be effected by conventional metallizing techniques, but preferably by a vacuum deposition process in which the metal is evaporated on to the receptive polyolefin surface in a chamber maintained under conditions of high vacuum. Suitable metals include nickel, copper, silver, gold, zinc, and preferably aluminum. As mentioned earlier, a thin transparent polymeric film can be adhered over the metallization in order to protect it such as from abrasion in handling of a finished package made from the composite film. The composite film which has been produced in this manner is wound up in the customary manner with the aid of a wind-up unit.

Preferred films of this invention can have tensile strengths of about 19,000 psi in the machine direction and 38,000 psi in the transverse direction.

A preferred film of this invention has: (a) a core layer with a thickness of about 58 gauge composed of about 97% by weight of isotactic polypropylene homopolymer, 3% by weight of high density polyethylene and 300 parts per million of glycerol monostearate; (b) a corona treated (white) cold seal receptive layer of 75% by weight of an ethylene-propylene random copolymer containing 3% to 5% by weight of ethylene, 25% of rutile titanium dioxide and 4,000 parts per million of 3 micron cross-linked silicone on one side of the core; and (c) on the other side of the core, a layer of 100% by weight of an ethylene-propylene random copolymer containing 3% of ethylene wherein the layer is treated on its surface with corona discharge and subsequently a film of aluminum is vacuum deposited thereon wherein the aluminum provides an optical density of about 2.0 to the film. Such film will typically have the following properties: a nominal thickness of 0.7 to 2.0 mil; a yield of 44,000 to 26,600 square inches per pound; a tensile strength of about 17,000 pounds per square inch in the machine direction and about 43,000 pounds per square inch in the transverse direction; an elongation of about 120% to 125% in the machine direction and about 40% to 30% in the transverse direction; a kinetic (film/film) coefficient of friction of about 0.40; an optical density of about 2.4; and an oxygen transmission of about 5 cubic centimeters per 100 square inches in 24 hours at 75° F. and 60% relative humidity.

All parts and percentages given in this specification and claims is by weight unless the context clearly indicates otherwise.

What is claimed is:

1. An oriented composite polyolefin film comprising:
   A. a polyolefin cold seal receptive layer containing
      (a) a slip agent in an amount sufficient to provide a coefficient of friction to such layer of not greater than about 0.4 and (b) from about 10% to 40% by weight of titanium dioxide;
   B. a polyolefinic core layer on one side of the sealable layer, said core layer being substantially free of cavitations, voids and fillers; and
   C. an obverse metallized layer on the side of the core opposite the cold seal receptive layer of the film, said metallized layer being sufficient to provide an optical density of at least 1.50 to the film and wherein the titanium dioxide in the cold seal receptive layer is enhanced by the obverse metallized layer to provide a white-opaque coloration to the cold seal receptive layer.

2. The film of claim 1 wherein the metal of the metallized layer is deposited on a transparent layer of an alpha-olefinic polymer of 2 to 3 carbon atoms adhering to the side of the core opposite from the cold seal receptive layer.

3. The film of claim 2 wherein: the film has a density of about 0.85 to 0.95 grams per cubic centimeter; the thickness of the cold seal receptive layer is from about 4 to 10 gauge; the thickness of the core layer is from about 50 to 200 gauge; and the thickness of the transparent layer adhering to the side of the core opposite from the cold seal receptive layer is from about 1 to 10 gauge.

4. The film of claim 3 wherein at least 90% by weight of the core layer is isotactic polypropylene homopolymer.

5. The film of claim 3 wherein the cold seal receptive layer is fabricated from alpha-olefin block and random copolymers having from 2 to 4 carbon atoms.

6. The film of claim 3 which is biaxially oriented.

7. The film of claim 3 wherein the surface of the cold seal receptive layer is surface treated for receptivity of a cold sealing coating.

8. An oriented composite white-opaque polymeric film comprising:
   A. a core layer, a cold seal receptive skin layer, and a metallized obverse skin layer wherein:
      (1) the core layer is transparent and fabricated of an alpha-olefin polymer having 2 to 3 carbon atoms;
      (2) the obverse skin layer is vacuum metallized to attain an optical density of at least 1.5; and
      (3) the cold seal receptive layer is subjected to physical surface-modifying treatment to improve its receptivity to other materials and comprises alpha-olefinic block or random polymer having from 2 to 3 carbon atoms and wherein such layer contains an anti-blocking agent in a quantity sufficient to render said layer substantially non-blocking and titanium dioxide in an amount sufficient to be enhanced by the obverse metallized layer so as to provide a white-opaque color to the film when viewed from the side of the sealable layer; said film having a density of about 0.85 to 0.95 grams per cubic centimeter.

9. The film of claim 8 wherein the polymer of the metallized layer is a member selected from the group consisting of isotactic polypropylene homopolymer, a block or random alpha-olefin polymer having 2 to 3 carbon atoms, and mixtures thereof.

10. The film of claim 8 wherein the thickness of the core layer is from about 50 to 200 gauge; the thickness of the obverse olefinic layer is from about 1 to 10 gauge; and the thickness of the heat sealable layer is from about 4 to 10 gauge.

11. The film of claim 8 wherein at least 90% by weight of the core layer is isotactic polypropylene homopolymer.

12. The film of claim 8 wherein the sealable layer contains from 10 to 40% by weight of titanium dioxide filler.

13. The film of claim 8 which has an optical density of at least 1.75.

14. A biaxially oriented polymer film comprising, by weight:
   A. a transparent core layer having a thickness of about 50 to 120 gauge fabricated from a member selected from the group consisting of (a) an ethylene-propylene random or block copolymer with from 0 to 50% of high density polyethylene, (b) isotactic polypropylene homopolymer with from about 1% to 10% by weight of high density polyethylene, and (c) mixtures thereof;
   B. a 4 to 10 gauge cold seal receptive skin layer adhering to one surface of the core layer, said receptive skin layer fabricated of an ethylene-propylene random or block copolymer containing from about 2% to 10% by weight of ethylene, said cold seal-receptive layer containing 10% to 40% of titanium dioxide and a slip agent in a quantity sufficient to provide a coefficient of friction of about 0.2 to 0.4; and
   C. a second transparent layer of about 1 to 10 gauge adhering to the other surface of the core layer, said second layer containing a member selected from the group consisting of (a) an ethylene-propylene random or block copolymer containing not more than 10% of ethylene, (b) an isotactic propylene homopolymer; and (c) mixtures thereof, said skin layer having a vacuum deposited coating of metal providing an optical density of at least 1.75 to the film.

15. The film of claim 14 wherein the surface of the cold seal receptive layer is surface treated to make it more receptive to coatings.

16. The film of claim 14 having a density of about 0.85 to 0.95 grams per cubic centimeter.

17. The film of claim 16 wherein the optical density is at least 2 and the metal is aluminum.

18. The film of claim 14 wherein the core layer is fabricated from isotactic polypropylene homopolymer and 1% to 10% by weight of high density polyethylene.

19. The film of claim 12 containing from 15% to 35% of titanium dioxide.

20. A biaxially oriented composite polyolefin film comprising:
   A. a transparent core layer of 50 to 200 gauge having a polyolefin core selected from the group consisting of:
      (1) about 90% to 98% by weight of an isotactic polypropylene homopolymer and about 2% to 10% by weight of high density polyethylene,
      (2) an ethylene-propylene random or block copolymer containing from about 2% to 10% of ethylene and 90% to 98% by weight of propylene and optionally up to about 50% by weight of high density polyethylene, and
      (3) mixtures thereof;
   B. a 4 to 10 gauge white corona treated polyolefin cold seal receptive skin layer on one side of the core, said skin layer containing about 10% to 40% by weight of titanium dioxide, 60% to 90% of an ethylene-propylene random copolymer containing about 2% to 10% of ethylene and about 98% to 90% of propylene; and from about 0.1% to 1% of a normally solid and non-migrating slip agent;
   C. the other side of the core having adhered thereto a 1 to 10 gauge polyolefin film selected from the group consisting of:
      (1) ethylene-propylene random copolymer containing from about 0.5% to 10% by weight of ethylene and 99.5% to 90% by weight of propylene,
      (2) isotactic polypropylene homopolymer together with from about 0.1 to 0.5% of an adhesion promoting agent to improve receptivity of vacuum deposited aluminum thereto; and
      (3) mixtures thereof;

the surface of the polyolefin film being treated for receptivity to vacuum deposition of aluminum thereon and aluminum being vacuum deposited thereon to obtain an optical density of about 2 to 4; and wherein the film has a density of about 0.85 to 0.95 grams per cubic centimeter.

21. The film of claim 20 wherein: the core layer is fabricated from about 2% to 10% of high density polyethylene and 90% to 98% by weight of isotactic polypropylene homopolymer; the other side of the core is that of an ethylene-propylene random copolymer containing about 0.5% to 10% by weight of ethylene and 90% to 99.5% by weight of propylene.

22. The film of claim 20 wherein the slip agent in the cold seal receptive layer is a cross-linked silicone having a particle size of about 1 to 4.5 microns in a quantity of about 0.1% to 1% by weight; and the core contains from about 0.1% to 0.2% of an antistatic agent.

23. The film of claim 20 wherein the quantity of slip agent is from about 0.1% to 0.5% by weight and is a member selected from the group consisting of cross-linked silicone; silica; a silicate; clay; diatomaceous earth; talc; glass beads; and calcium carbonate.

* * * * *